United States Patent
Maekawa et al.

(10) Patent No.: US 11,049,838 B2
(45) Date of Patent: Jun. 29, 2021

(54) CONDUCTIVE BUMP AND ELECTROLESS PT PLATING BATH

(71) Applicant: C. Uyemura & Co., Ltd., Osaka (JP)

(72) Inventors: Takuma Maekawa, Osaka (JP); Yukinori Oda, Osaka (JP); Toshiaki Shibata, Osaka (JP); Yoshito Ii, Osaka (JP); Sho Kanzaki, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 16/503,785

(22) Filed: Jul. 5, 2019

(65) Prior Publication Data

US 2020/0020660 A1  Jan. 16, 2020

(30) Foreign Application Priority Data

Jul. 12, 2018 (JP) .............................. JP2018-132514

(51) Int. Cl.
*H01L 23/48* (2006.01)
*H01L 23/00* (2006.01)

(52) U.S. Cl.
CPC ............ *H01L 24/742* (2013.01); *H01L 24/11* (2013.01); *H01L 24/17* (2013.01); *H01L 2224/11464* (2013.01); *H01L 2924/01046* (2013.01); *H01L 2924/01047* (2013.01); *H01L 2924/01078* (2013.01); *H01L 2924/01079* (2013.01)

(58) Field of Classification Search
CPC ....... H01L 24/11; H01L 24/17; H01L 24/742; H01L 2224/11464; H01L 2924/01046; H01L 2924/01047; H01L 2924/01078; H01L 2924/01079

USPC .......................................... 257/734–740, 737
See application file for complete search history.

(56) References Cited

U.S. PATENT DOCUMENTS

| | | | | |
|---|---|---|---|---|
| 6,222,272 B1* | 4/2001 | Takayama | ........... | H01L 23/4985 257/737 |
| 6,724,084 B1* | 4/2004 | Hikita | ..................... | H01L 24/14 257/737 |
| 6,917,509 B1* | 7/2005 | Devoe | ................... | H01G 2/065 361/305 |
| 2003/0111729 A1* | 6/2003 | Leu | ........................ | H01L 21/288 257/758 |
| 2008/0308931 A1* | 12/2008 | Rinne | .................... | H01L 24/13 257/737 |
| 2009/0026486 A1* | 1/2009 | Jinushi | ................ | H01L 33/0079 257/99 |

(Continued)

FOREIGN PATENT DOCUMENTS

| | | |
|---|---|---|
| JP | 2016-32171 | 3/2016 |
| JP | 2016-54179 | 4/2016 |
| JP | 2017-79297 | 4/2017 |

*Primary Examiner* — Nitin Parekh
(74) *Attorney, Agent, or Firm* — Wenderoth, Lind & Ponack, L.L.P.

(57) ABSTRACT

The present invention provides a bump that can prevent diffusion of a metal used as a base conductive layer of the bump into a surface of an Au layer or an Ag layer. A conductive bump of the present invention is a conductive bump formed on a substrate. The conductive bump comprises, at least in order from the substrate:
a base conductive layer;
a Pd layer;
a Pt layer; and
an Au layer or an Ag layer having directly contact with the Pd layer, wherein a diameter of the conductive bump is 20 μm or less.

13 Claims, 2 Drawing Sheets

(56) References Cited

U.S. PATENT DOCUMENTS

| | | | |
|---|---|---|---|
| 2013/0161814 A1* | 6/2013 | Su | H01L 23/49827 |
| | | | 257/737 |
| 2013/0180757 A1* | 7/2013 | Uno | H01L 24/48 |
| | | | 174/126.2 |
| 2015/0194409 A1* | 7/2015 | Chuang | H01L 24/11 |
| | | | 257/737 |

* cited by examiner

CONDUCTIVE BUMP AND ELECTROLESS PT PLATING BATH

CROSS-REFERENCE TO RELATED APPLICATIONS

This application is related to and claims priority under 35 U.S.C. 119 to Japanese patent application No. 2018-132514, filed on Jul. 12, 2018.

TECHNICAL FIELD

The present invention relates to an electro-conductive bump and an electroless Pt plating bath.

BACKGROUND ART

In semiconductor integrated circuits, such as Large Scale Integration (LSI) built of Integrated Circuit (IC) chips, wire bonding have been commonly used as a method of electrically interconnecting IC chips together, or connecting IC chips and circuit boards. With downsized electronic equipment and highly densified integrated circuits in recent years, a three-dimensional integrated circuit that three-dimensionally interconnects IC chips together has attracted attention. As a mounting technique that is compatible with a stacked semiconductor integrated circuit such as the three-dimensional integrated circuit, flip-chip bonding has been adopted. Flip-chip bonding electrically connects an IC chip to a connecting part of counterpart substrate via projecting terminals called bumps that are formed on the IC chip. Because Flip-chip bonding requires shorter wiring and then can make a mounting area smaller, it is applied to portable equipment that is required to be compact and thin.

The semiconductor integrated circuit is required to have low resistivity, low contact resistance (hereinafter these are referred to as 'electrical characteristic') and favorable connectivity (hereinafter referred to as 'connection characteristic') on an electrical connection with the IC chips (all these characteristics are referred to as 'connection reliability'). Researches on these characteristics are being carried out. Materials for the bumps of the IC chips are considered in various ways. As a bump that achieves low cost and has excellent connection reliability, Patent Documents 1 and 2, for example, disclose a bump in which an Au layer is directly formed on a base conductive layer such as Ni and the like (hereinafter referred to as 'Ni—Au bump').

As a substrate, materials such as a silicon wafer and the like, that have excellent heat resistance is used instead of a paper phenolic resin, such as a bakelite plate. Temperature of thermal history that is applied to a process of semiconductor fabrication has increased and may reach 300° C. or more. For that reason, it has been pointed out, as a problem of the Ni—Au bump, that Ni of the base conductive layer diffuses onto a surface of the Au layer and consequently reduces the connection reliability owing to the high thermal history of 300° C. or more (hereinafter may be referred to as 'high-temperature thermal history'). As a countermeasure against it, Patent Document 3, for example, suggests a technique that forms a Pt layer between the Ni layer and the Au layer.

PRIOR ART DOCUMENT

Patent Documents

Patent Document 1: JP2017-79297A
Patent Document 2: JP2016-032171A
Patent Document 3: JP2016-54179A

SUMMARY OF THE INVENTION

Problems to be Solved by the Invention

In recent years, it has been under consideration that the IC chips are interconnected with each other via tiny bumps whose diameters are 20 m or less (hereinafter may be referred to as 'micro bump') as a means to highly densify the three-dimensional integrated circuit. However, in case of a micro bump, the Pt layer cannot be formed directly on the base conductive layer, and thus the connection reliability of the micro bump has become a subject of a problem.

Also, it has been conventionally pointed out that an electroless Pt plating bath is unstable and Pt particles are likely to be deposited. Hence, it has been necessary to improve stability of the electroless Pt plating bath to industrialize it.

The present invention has been accomplished in view of the above circumstances and the object of the present invention is to provide a bump that can prevent a metal used as a base conductive layer (hereinafter may be referred to as 'base metal') from diffusing into a surface of an Au layer or an Ag layer; and an electroless Pt plating bath being suitable for forming a Pt layer that is effective for preventing the diffusion, and being excellent in stability of the Pt plating bath.

Solution to Problem

A conductive bump of the present invention that can solve the above problems has the following constitution.

(1) A conductive bump formed on a substrate, comprises, at least in order from the substrate side:

a base conductive layer;

a Pd layer;

a Pt layer; and an Au layer or an Ag layer having directly contact with the Pd layer wherein the Pt layer is in direct contact with the Pd layer, and wherein a diameter of the conductive bump is 20 µm or less.

In addition, the conductive bump of the present invention preferably comprises the following composition.

(2) The conductive bump according to (1), wherein the base conductive layer is at least one metal selected from the group consisting of Ni, Cu, Co, Al and W or an alloy thereof.

(3) An electronic component comprises above substrate and a counterpart substrate, wherein the substrate and the counterpart substrate are electrically connected with each other by the Au layer or the Ag layer of the substrate.

(4) An electroless Pt plating bath for forming the Pt layer according to any one of (1) to (3), wherein the electroless Pt plating bath comprises a water-soluble platinum compound, a reducing agent, a buffer agent and ammonium chloride.

(5) The electroless Pt plating bath according to (4), wherein the reducing agent is at least one selected from the group consisting of formic acid or a salt thereof and a hydrazine compound.

Advantageous Effects of Invention

The bump of the present invention can prevent the base meal from diffusing into the surface of the Au or Ag layer, and thus achieves excellent connection reliability. In addition, the electroless Pt plating bath of the present invention is excellent in plating bath stability.

DESCRIPTION OF EMBODIMENTS

The present inventors have pondered over a method for preventing diffusion of a base metal in a micro bump. When a Pt layer is formed on a base conductive layer of the micro bump by electroless plating, a Pt plating solution needs to be passed through apertures whose diameter is several tens m or less on a passivation film to form the Pt plating film on a surface of the base conductive layer (hereinafter the surface may be referred to as 'micro area'). It is difficult for conventional electroless Pt plating baths to achieve a favorable covering property on this micro area. This means that there are pinholes on the Pt plating film or the base conductive layer is not entirely covered with the Pt plating film, and thus a part of the base conductive layer is exposed. This makes it difficult to form the Pt plating layer having no defect that may be a cause of diffusion of the base metal. It is also considered to form the Pt plating film by an evaporation method. However, it has been difficult for this method to sufficiently deposit Pt on the micro area. Therefore, connection reliability of the micro bumps manufactured by these methods has been low.

The connection reliability may be improved by increasing deposit thickness of an Au layer even though the covering property of the Pt layer is insufficient. The drawback of thick deposition of the Au layer is to increase manufacture cost. And thick deposition of the Au layer cannot be adopted because the Au layer is also required to be as thin as possible on a stacked semiconductor integrated circuit.

The present inventors have been experimenting on preventing effects on the diffusion of the base metal, using various metals having electrical conductivity (hereinafter called 'conductive metal'). Firstly, the inventors have examined the diffusion preventing effect of the base conductive layer formed by Co, Cu and the like as examples of the conductive metals other than Ni. However, in a micro bump formed with a dual layer structure of this base conductive layer and the Au layer, the base metal has diffused into a surface of the Au layer owing to high-temperature thermal history. Secondly, the present inventors have interposed a conductive layer, which is different from the base conductive layer, between the base conductive layer and the Au layer. Examples of the conductive layer include a Pd-based alloy layer, Ni-based alloy layer and Co-based alloy layer containing an alloying element such as P, B, W or the like. This, however, has yielded no diffusion preventing effect once high-temperature thermal history is applied.

As a result of further examinations, the present inventors have found that a configuration comprising a conductive metal distinctly different from conventional conductive metals improves reactivity of a Pt plating solution and then enhances depositability of Pt on a Pd layer, consequently enabling formation of a Pt layer having a favorable covering property. In this configuration, the Pd layer is deposited between the Pt layer and the base conductive layer and the Pt layer is formed directly on the Pd layer. Hence, a micro bump in which the Pd layer, Pt layer and Au layer are formed in order from a substrate can prevent the base metal from diffusing into a surface of the Au layer even though high-temperature thermal history is applied.

The present inventors has also taken the following problem into account. Conventional Pt plating baths are unstable and thus causing Pt particles to deposit in the baths, making it difficult to form the above Pt layer by electroless plating.

As a result of examinations on the above problems about stability of a plating bath for the electroless Pt plating bath and the favorable covering property on the micro area and the like, the present inventors have found that an ammonium chloride-enriched electroless Pt plating bath achieves excellent plating bath stability and enables formation of a Pt plating film having excellent covering property on the micro area on which a Pd layer has been formed. Although conventional electroless Pt plating baths contain an ammonium salt originated from amine such as tetraamine platinum salt used as a water-soluble platinum compound, the above problem has arisen. The problem is not overcome by chloride-enriched plating baths prepared by addition of chloride such as sodium chloride either. Likewise, the problem is not overcome by ammonia-enriched plating baths prepared by addition of ammonium because covering property has deteriorated although stability of the plating baths has been improved. However, it has been surprisingly found that an electroless Pt plating bath exhibits excellent effects on both the plating bath stability and the covering property when the Pt plating bath is made to be more ammonium chloride-enriched than conventional electroless Pt plating baths by addition of ammonium chloride and the other constituents of the plating bath is optimized. The present inventors have arrived at the development of an electroless Pt plating bath of the present invention on a basis of these findings.

Figure 1:
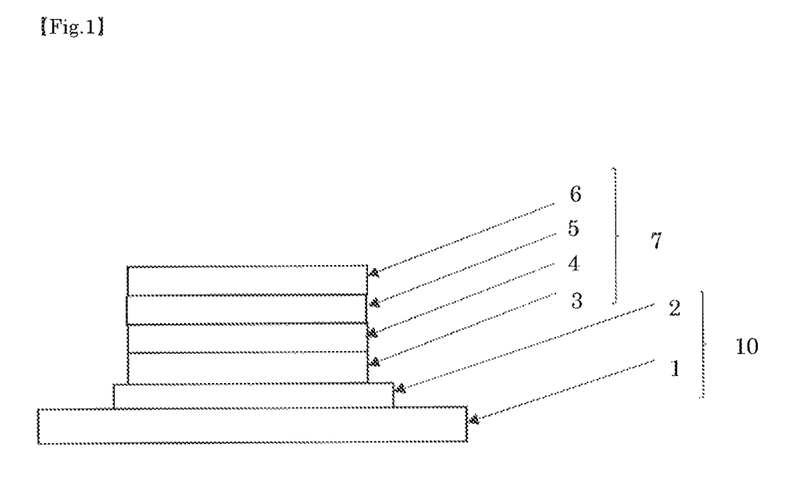
FIG. 1 is a schematic cross-sectional view showing a configuration of a bump of the present invention.

Although a configuration of a conductive bump of the present invention will be hereinafter described according to FIG. 1, a conductive bump of the present invention is by no means limited to the following configuration and may be implemented with appropriate modifications within a range not deviated from the gist of the present invention.

The gist of the conductive bump 7 related to the present invention is to comprise at least the base conductive layer 3, the Pd layer 4, the Pt layer 5, and the Au layer 6 or the Ag layer 6 in order from the substrate 10.

The substrate 10 is the base substrate 1 having a connecting part 2, such as an electrode, on which the conductive bump 7 of the present invention is formed. As the substrate 10, various electronic components such as an IC chip, integrated circuit of IC chips, a circuit board and the like are exemplified. Materials for the base substrate 1 are not limited, and various known substrates, such as a resin, metal, ceramic, silicon, glass and mixed materials of these, may be used. Amongst these, silicon having excellent high heat resistance to 300° C. or more is preferable for the present invention, and various silicon wafers may be used.

Conductive Bump

In the present invention, the conductive bump 7 is a protruding terminal formed on at least one side of the substrate 10 to electrically connect the substrate 10 and the counterpart substrate (8 in FIG. 2) and is a stacked body composed of the layers described below. The conductive bump 7 can be formed into an arbitrary shape known in the art.

The conductive bump 7 can take any size according to its application. Thus thickness of the conductive bump 7 may be adjusted according to its application and is not limited.

The thickness may be preferably 100 μm or less and more preferably 50 μm or less. The lower limit of the conductive bump 7 thickness is not limited and is preferably several μm or more and more preferably 10 μm or more. Also, the conductive bump 7 of the present invention is a micro bump having its diameter of 20 μm or less, more preferably 15 μm or less and further preferably 10 μm or less. The diameter of the bump means the maximum diameter of its outermost surface. In the case when the diameter varies in its height position such as cone shaped conductive bump 7, the diameter of the bump means the maximum diameter of the Pt layer formed surface. The diameter of a bump is a measured value by a digital microscope and its details conform to the conditions described in Examples.

Each layer constituting the conductive bump 7 of the present invention is explained below.

Base Conductive Layer

The base conductive layer 3 is a conductive underlayer of the conductive bump 7 formed on the connecting part 2 of the substrate 10 for improving heat resistance. The base conductive layer 3 may be composed of a metal having conductivity and is preferably at least one metal selected from the group consisting of Ag, Sn, Pd, Ni, Cu, Co, Al, and W or an alloy thereof and more preferably at least one metal selected from the group consisting of Ni, Cu, Co, Al and W or an alloy thereof, and further preferably Ni, Co or an alloy thereof. The alloy element may be selected in combination with various know alloy elements and the alloy element is preferably at least one selected form the group consisting of P, B and W. Specific examples of the base conductive layer include a Ni based alloy such as P—Ni based alloy, B—Ni based alloy, W—Ni based alloy and W—P—Ni based alloy; a Co based alloy such as P—Co based alloy, B—Co based alloy and W—P—Co based alloy. Ratio of the base metal to the alloy element that constitute the base conductive layer 3 is not limited. The proportion of the alloy element is preferably less than 50 mass %, more preferably 15 mass % or less and further preferably 10 mass % or less. In addition, the base conductive layer 3 may be composed of one metal (or its alloy) or of a combination of two or more metals (or their alloy).

Heat resistance and the like of the connecting part 2 may be improved by adjusting the thickness of the base conductive layer 3. For improving the effect, the thickness of the base conductive layer 3 is preferably 0.01 μm or more, more preferably 0.1 μm or more and further preferably 0.3 μm or more whereas such improvement can be much enhanced by increasing the thickness of the base conductive layer 3. The thickness of the base conductive layer 3 may be adjusted depending on the thickness of the micro bump and may be preferably 20 μm or less, more preferably 10 μm or less and further preferably 5 μm or less.

Pd Layer

In the present invention, the Pd layer 4 is formed between the base conductive layer 3 and the Pt layer 5. The Pt layer 5 having excellent covering property is obtained by improving Pt depositability by forming the Pd layer 4 between the base conductive layer 3 and the Pt layer 5 in which the Pt layer 5 is formed directly on the Pd layer 4 and consequently yields excellent diffusion preventing effect. In FIG. 1, one side of the Pd layer 4 contacts the base conductive layer 3 and the other side of the Pd layer 4 contacts the Pt layer 5. The Pd layer 4 is composed of Pd or Pd alloy (hereinafter they bath may be called 'Pd layer'). The Pd layer may be composed of Pd and the balance inevitable impurities. The Pd alloy layer is preferably a Pd—P alloy. Also, content rate of P in the Pd—P alloy is preferably 15 mass % or less and more preferably 10 mass % or less.

Thickness of the Pd layer 4 may be adjusted to obtain the desired effects and may be preferably 0.005 μm or more, more preferably 0.01 μm or more and further preferably 0.1 μm or more. On the other hand, the Pd layer 4 may be adjusted depending on the thickness of the micro bump and may be preferably 5 μm or less, more preferably 1 μm or less and further preferably 0.5 μm or less.

Though it is not illustrated, one or more intermediate conducive layers, if necessary, may be formed between the base conductive layer 3 and the Pd layer 4. When the intermediate conductive layer is formed, any conductive metals may be adopted for its metal composition according to their application and properties. Examples of the optional conductive metals include the metals and the alloys thereof exemplified for the base conductive layer 3. Thickness of the intermediate conductive layer may be adjusted to obtain the desired effects and may be similar to the thickness of the Pd layer 4.

Pt Layer

The Pt layer 5 exhibits the diffusion preventing effect as described above. The Pt layer 5 and the Au layer 6 (or the Ag layer 6) are preferably in direct contact with each other. If other metal layers are interposed between the Pt layer 5 and the Au layer 6 (or the Ag layer 6), the interposed other metal layers may diffuse into a surface of the Au layer 5. On the other hand, to exhibit the diffusion preventing effect by Pt layer 5, the Pt layer 5 needs to have no defect, such as the pinholes, that may cause the base metal diffusion. As a configuration that achieves a favorable covering property, the substrate 10 side surface of the Pt layer 5 contacts directly with the Pd layer 4. Considering the covering property, the Pt layer 5 is preferably composed of Pt having purity as high as possible and may contain inevitable impurities to a degree that the covering property is not affected.

Adjustment of the Pt layer 5 thickness leads to more excellent diffusion preventing effect. For enhancing the diffusion preventing effect, the thickness of the Pt layer 5 is preferably 0.005 μm or more, more preferably 0.01 μm or more and further preferably 0.1 μm or more. On the other hand, although increasing the Pt layer thickness achieves much higher diffusion preventing effect. The thickness of Pt layer is preferably 5 μm or less, more preferably 3 μm or less and further preferably 1 μm or less to avoid the heightened conductive bump 7 may impede slimness.

Au Layer or Ag Layer

Figure 2:
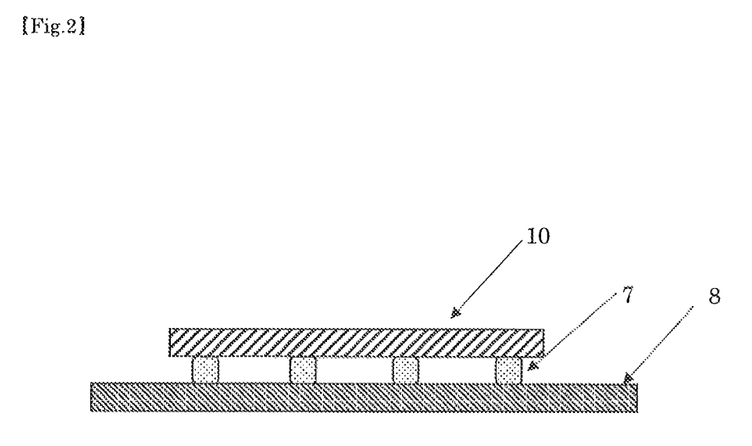
FIG. 2 is a schematic cross-sectional view showing a configuration of an electronic component in which a substrate with a bump of the present invention and a counterpart substrate are connected with each other.

The Au layer 6 or Ag layer 6 formed as an outermost surface of the conductive bump 7 exhibits favorable connection reliability with the counterpart substrate (8 in FIG. 2). The outermost surface of the conductive bump 7 means a surface toughing the counterpart substrate or a component of the counterpart substrate. Besides, the Au layer 6 or Ag layer 6 may be or may not be formed on a periphery of the conductive bump 7 that is not in contact with the counterpart substrate.

Au Layer

The Au layer 6 is formed as an outer layer of the bump to exhibit excellent connection reliability. In the present invention, the diffusion preventive effects can be obtained by the Pt layer 5 descried above, the Au layer 6 may be thinly formed. The thickness of the Au layer 6 may be preferably 5 μm or less, more preferably 3 μm or less and further preferably 1 μm or less. The lower limit of the thickness of the Au layer 6 is not limited but is preferably 0.005 μm or more, more preferably 0.01 μm or more and further preferably 0.1 m or more. Considering its connection reliability, the Au layer is preferably composed of Au having purity as high as possible but may contain inevitable impurities to a degree that the connection reliability is not affected.

Ag Layer

The Ag layer 6 is formed as an outer layer of the bump to exhibit excellent connection reliability. In the present invention, diffusion preventing effect can be obtained by the Pt layer 5 described above, the Ag layer 6 may be thinly formed. The thickness of the Ag layer 6 may be preferably 5 μm or less, more preferably 3 μm or less and further preferably 1 μm or less. The lower limit of the thickness of the Ag layer 6 is not limited but is preferably 0.005 μm or more, more preferably 0.01 μm or more and further preferably 0.1 μm or more. Considering its connection reliability, the Ag layer 6 is preferably composed of Ag having purity as high as possible but may contain inevitable impurities to a degree that the connection reliability is not affected.

Electronic Component

The substrate 10 having the conductive bump 7 of the present invention may be electrically connected with the counterpart substrate via the conductive bump to constitute an electronic component. The counterpart substrate may have a composition that is the same as or different from the composition of the substrate 10. Examples of the counterpart substrate also include any substrates, such as an IC chip, integrated circuit of IC chips, a circuit board and the like, that have connectable connecting parts to the substrate 10 and are not limited thereto. When, for example, the conductive bump 7 of the present invention is formed on an IC chip, the IC chip may be electrically connected to a circuit board, or may be electrically connected to other IC chip to form a three-dimensional integrated circuit. Also, a plurality of the IC chips may be stacked on one another.

FIG. 2 shows a state in which the substrate 10 on which the conductive bumps 7 of the present invention are formed is connected to the counterpart substrate 8 via flip-chip bonding. A structure of connecting parts (not illustrated) of the counterpart substrate 8 that are electrically connected to the conductive bumps 7 is not limited, and any optional connecting parts, such as pad electrodes and the like, that are connected to semiconductor circuit patterns, such as signal lines, are exemplified. As connection methods, any various known methods, such as ultrasonic bonding, thermocompression bonding and the like, may be adopted.

Manufacturing Method

A preferable manufacturing method of the conductive bump 7 of the present invention will now be described. The manufacturing method of the conductive bump 7 of the present invention is not limited to the following method and may be optionally modified.

As the substrate 10 on which conductive bumps 7 are to be formed, various substrates manufactured by conventionally known methods may be used. The conductive bumps 7 are formed on the connecting parts of the substrate 10. The conductive bumps 7 may be formed, for example, on connecting parts 2 such as pad electrodes connected to various lines, such as signal lines and power lines of an integrated circuit on the substrate 10. The connecting parts 2 of the substrate 10 on which the conductive bumps 7 are to be formed may be composed, for example, of a metal foil, such as copper, aluminum, iron, nickel, chrome and molybdenum, or an alloy foil thereof, or may be composed of a copper alloy, such as aluminum bronze, phosphor bronze and yellow bronze, or may be composed of stainless steel, amber, a nickel alloy, a tin alloy or the like. Furthermore, between the connecting part 2 and the base conductive layer 3 of the conductive bump 7, various metal films, such as Ti, Cr, W and the like, that have enhancing effects on adhesion may be formed in order to enhance adhesion therebetween. Prior to forming the conductive bump 7, the substrate 10 may be, if necessary, subjected to various pretreatments, such as a cleaning treatment, pickling and the like, and then the base conductive layer 3 may be formed.

Formation of Base Conductive Layer

The base conductive layer 3 is to be formed on the connecting part 2. The base conductive layer 3 may be formed by various known methods, such as electrolytic plating, electroless plating, displacement plating, stud bumping, transfer printing and the like. A preferable method is electroless plating. A passivation film that is to protect semiconductor elements on a substrate is formed by, for example, forming a resist film on the substrate, and then an opening for a bump is formed on the passivation film by photoresist, etching or the like. After any pretreatments, such as the cleaning treatment, a zincate treatment and the like, are carried out, according to need, a plating film, namely the base conductive layer 3, is formed on a connecting part of the substrate that has the opening for a bump by carrying out electroless plating with an electroless plating bath. When the base conductive layer 3 is to be formed by the electroless plating, any known treating conditions may be adopted, and a composition, pH value, treating temperature, treating time and the like of the electroless plating bath is not limited. After the intermediate conductive layer is formed on the base conductive layer 3, the Pd layer that is to be described below may be formed. When the intermediate conductive layer is to be formed on the base conductive layer 3, a desired intermediate conductive layer may be formed by various known methods such as electroless plating and the like.

Formation of Pd Layer

The Pd layer 4 is to be formed after the base conductive layer 3 is formed. A method for forming the Pd layer 4 is not limited, and the Pd layer 4 may be formed by various known methods, like the base conductive layer 3. When the base conductive layer 3 is formed following formation of the passivation film, it is preferable to form the Pd layer 4 by consecutively carrying out electroless plating. When the Pd layer 4 is to be formed by the electroless plating, any various known treating conditions may be adopted, and a composition, pH value, treating temperature, treating time and the like of an electroless plating bath are not limited. The Pd layer 4 may be formed, if necessary, after the intermediate conductive layer is formed on the base conductive layer 3.

Formation of Pt Layer

The Pt layer 5 is to be formed after the above described Pd layer 4 is formed. It is preferable to form the Pt layer 5 by electroless plating. When the Pt layer 5 is to be formed by the electroless plating, it is preferable to utilize the following electroless Pt plating bath of the present invention, considering stability and a covering property of the plating bath.

Electroless Pt Plating Bath

An electroless Pt plating bath of the present invention contains a water-soluble platinum compound, reducing agent, buffer agent and ammonium chloride. Although conventional electroless Pt plating baths contain ammonium chloride derived from water-soluble platinum compounds, the present invention is characterized by ammonium chloride contained that exceeds the chemical equivalent ratio to the water-soluble Pt compound. A concentration of ammonium chloride in the electroless Pt plating bath is preferably 10 g/L or less, more preferably 5 g/L or less and further preferably 1 g/L or less. Because a low concentration of ammonium chloride may cause low stability of the plating bath and may not yield a favorable covering property for a micro bump, the concentration of ammonium chloride is preferably 1 ppm or more, more preferably 10 ppm or more and further preferably 100 ppm or more. An electroless Pt plating solution of the present invention is preferable because it can form the Pt layer 5 having a favorable covering property on the Pd layer 4 in the passivation film with the apertures whose diameter is several tens of μm or less, for example 20 μm or less, as described above.

Water-Soluble Platinum Compound

As the water-soluble platinum compound, a common platinum salt may be used, and, for example, dinitrodiammine platinum, chloroplatinate, tetraammine platinum salt, hexaammine platinum salt or the like may be used. These platinum compounds may be used alone or in combination of two or more kinds.

Regarding an amount of the water-soluble platinum compound, a concentration of platinum in the electroless Pt plating bath is preferably 0.1 g/L or more and more preferably 0.5 g/L or more in order to improve the productivity. Also, in terms of stability of the plating bath, the concentration is preferably 3.0 g/L or less and more preferably 2.0 g/L or less.

Reducing Agent

A reducing agent that can reduce and deposit Pt ions may be used. A reducing agent is preferably at least one selected from the group consisting of formic acid or a salt of formic acid (hereinafter these may be called formic acid compound) and a hydrazine compound that have excellent effects on enhancement of depositability of Pt plating. A more preferable reducing agent is a formic acid compound and it is excellent in stability of a plating bath, depositability of Pt plating, corrosion inhibition for the base metal and the like. A Pt plating bath containing the hydrazine compound is desirable because it has depositability of Pt plating on the micro bump although stability of the plating bath is low and thus inferior in long term storage.

Formic Acid Compound

The Formic acid compound is formic acid or a salt of formic acid. Examples of the salt of formic acid include a formic acid compound such as an alkaline metal salt of formic acid, for example potassium formate and sodium formate; an alkaline earth metal salt of formic acid, for example magnesium formate and calcium formate; an ammonium salt of formic acid, a quaternary ammonium salt of formic acid, and an amine salt of formic acid including a primary to tertiary amine. In the present invention, the formic acid or the salt formic acid may be used alone or in combination of two or more kinds.

In order to sufficiently exhibit the above effects, a total concentration of the formic acid compounds in the electroless Pt plating bath is preferably 1 g/L or more, more preferably 5 g/L or more and further preferably 10 g/L or more. On the other hand, if they are excessively contained, the plating bath is likely to become unstable so that a total concentration of the formic acid compounds is preferably 100 g/L or less, more preferably 80 g/L or less and further preferably 50 g/L or less.

Hydrazine Compound

Examples of the hydrazine compound include hydrazine; hydrazine hydrate, such as hydrazine monohydrate; a hydrazine salt, such as hydrazine carbonate, hydrazine sulfate, neutral hydrazine sulfate and hydrazine hydrochloride; an organic derivative of hydrazine, such as a pyrazole compound, triazole compound and hydrazide compound. Examples of the pyrazole compound include a pyrazole derivative, such as 3, 5-dimethylpyrazole, 3-methyl-5-pyrazolone, in addition to pyrazole. Examples of the triazole compound include 4-amino-1, 2, 4-triazole, 1, 2, 3-triazole and the like. Examples of the hydrazide compound include adipic acid dihydrazide, maleic acid hydrazide, carbohydrazide and the like. Hydrazine hydrate, such as hydrazine monohydrate, and hydrazine sulfate are preferable. These may be used alone or in combination of two or more kinds.

A total concentration of the hydrazine compounds in the electroless Pt plating bath is preferably 0.1 g/L or more, more preferably 0.3 g/L or more and further preferably 1.0 g/L or more, and preferably 5 g/L or less and more preferably 3 g/L or less.

Buffer Agent

A buffer agent has a function of adjusting a pH value of the plating bath. The pH value is preferably 3 or more, considering stability of the plating bath. Also, the pH value is preferably 11 or less, considering deposition rate of the Pt plating layer. Especially, when formic acid is used as the reducing agent, an alkalescent condition of approximately pH 10 to pH 9 is more preferable in order to form the Pt layer that can yield the above effects of the present invention with the consideration of the plating bath stability and environmental impact. Specifically, the pH value may be less than pH 10 or pH 10 or less, or above pH 9 or pH 9 or more. The buffer agent may be appropriately selected depending on a pH value to be adjusted, and, for example, hydrochloric acid, sulfuric acid, nitric acid, phosphoric acid, carboxylic acid or the like may be selected as acid, whereas sodium hydroxide, potassium hydroxide, aqueous ammonia or the like may be selected as alkali. Also, examples of the pH buffer agent include carboxylic acid, such as citric acid, tartaric acid, malic acid, phthalic acid and the like; phosphoric acid, such as orthophosphoric acid, phosphorous acid, hypophosphorous acid, pyrophosphoric acid and the like, or phosphate, such as a potassium salt, sodium salt, ammonium salt thereof and the like; boric acid or tetraboric acid. A concentration of the buffer agent is not limited and may be adjusted by the addition of appropriate quantities to achieve the above desired pH value.

Ammonium Chloride ($NH_4Cl$)

Increasing a concentration of ammonium chloride in the electroless Pt plating bath can improve the plating bath stability. Specifically, the increased ammonium chloride concentration can prevent deposition of Pt particles even though the temperature of the plating bath is kept at plating temperature, such as within a range of 50 to 90° C. for at least a few days, preferably 30 to 60 days. Also, by increasing a concentration of ammonium chloride in the electroless Pt plating bath, the plating bath can deposit the Pt plating layer having an excellent covering property and thus exhibit the diffusion preventing effect. A concentration of ammonium chloride in the electroless Pt plating bath is preferably 0.001 g/L or more, more preferably 0.01 g/L or more and further preferably 0.1 g/L or more in order to enhancing such effects. Although the higher concentration of ammonium chloride attains more improved above effect, if the concentration becomes excessive, the buffer agent needs to be added to maintain a pH value of the plating bath and the other constituents of the plating bath may necessitate adjustments. Accordingly, a concentration of ammonium chloride is preferably 20 g/L or less, more preferably 15 g/L or less, further preferably 10 g/L or less, still further preferably 5 g/L or less and especially preferably 1 g/L or less.

The electroless Pt plating bath of the present invention may be composed of the water-soluble platinum compound, reducing agent, buffer agent and ammonium chloride and may contain other additives. As such additives, various known additives may be exemplified. The electroless Pt plating bath of the present invention may contain inevitable impurities to a degree that the effects of the present invention are not inhibited.

A treating condition of electroless plating of present inventive electroless Pt plating bath may adopt a condition of electroless plating for conventionally known electroless Pt plating baths with appropriate adjustments. The temperature at which the Pt plating bath is used is preferably 50° C. or more, more preferably 60° C. or more and further preferably 70° C. or more, and preferably 90° C. or less and more preferably 80° C. or less. Treating time may be appropriately adjusted to achieve a desired deposit thickness and is preferably 1 minute or more and more preferably 5 minutes or more, and preferably 60 minutes or less and more preferably 10 minutes or less.

Formation of Au Layer

After the Pt layer 5 is formed, the Au layer 6 is formed. A method for forming the Au layer 6 is not limited, and the Au layer may be formed by various known methods. After the Pt layer 5 is formed by electroless plating following the formation of the passivation film, it is preferable to form the Au layer 6 by consecutively carrying out electroless plating. When the Au layer 6 is to be formed by electroless plating, various known treating conditions may be adopted. A composition, pH value, treating temperature, treating time and the like of an electroless plating bath are not limited.

Formation of Ag Layer

After the Pt layer 5 is formed, the Ag layer 6 may be formed instead of the Au layer 6. A method for forming the Ag layer 6 is not limited, and the Ag layer may be formed by various known methods. When the Pt layer 5 has been formed by electroless plating following the formation of the passivation film, it is preferable to form the Ag layer 6 by consecutively carrying out electroless plating. When the Ag layer 6 is to be formed by electroless plating, various known treating conditions may be adopted. A composition, pH value, treating temperature, treating time and the like of an electroless plating bath are not limited.

After the Au layer 6 or the Ag layer 6 is formed, the passivation film is removed. Thereafter, various known post-treatments, such as a cleaning treatment and the like, may be carried out, if necessary. By the above production method, the conductive bump 7 of the present invention in which at least 'the base conductive layer 3', 'the Pd layer 4', 'the Pt layer 5', and 'the Au layer 6 or the Ag layer 6' are formed in order from the substrate 10 can be manufactured.

EXAMPLES

Next, the present invention will be described more concretely by way of Examples and Comparative Examples. However, the present invention is by no means limited by modes of the Examples, and may appropriately be modified within a range not deviated from the gist of the present invention.

Example 1

After a sample that corresponded to a conductive bump of the present invention was heated at 300° C. for an hour, metals that diffused onto a surface of an Au layer were examined.

A stacked body of conductive metal layers that corresponded to the conductive bump was prepared by electroless plating. First of all, a substrate was subjected to a pretreatment by sequentially carrying out processes 1 to 5 under a condition described in Table 1 prior to the electroless plating. In Table 1, MCL-16 and MCT-51 are respectively EPITHAS (a registered trademark) MCL-16 and EPITHAS MCT-51 that are available from C. Uyemura & Co., Ltd.

TABLE 1

| Process | Treating Solution | Concentration (ml/L) | Treating Temperature | Treating time (second) |
|---|---|---|---|---|
| 1 Degreasing | MCL-16 | 500 | 50° C. | 300 |
| 2 Pickling | 30 mass % Nitric acid | 500 | Normal temperature | 60 |
| 3 First zincate | MCT-51 | 500 | Normal temperature | 30 |
| 4 Pickling | 30 mass % Nitric acid | 500 | Normal temperature | 60 |
| 5 Second zincate | MCT-51 | 500 | Normal temperature | 30 |
| 6 | Various electroless plating processes | | | |
| 7 | Electroless Au or Ag plating process | | | |

As the pretreatment, the following processes 1 to 5 were sequentially carried out.

Process 1: A cleaning treatment (at 50° C., for 300 minutes) for the substrate (Al TEG wafer) was carried out with MCl-16.

Process 2: An oxide film was formed on a surface of the substrate Al by carrying out pickling (at normal temperature, for 60 minutes) with a nitric acid solution of 30 mass %.

Process 3: A first zincate treatment (at normal temperature, for 30 minutes) was carried out with MCT51.

Process 4: A Zincate displacement coating was peeled by carrying out pickling (at normal temperature, for 60 minutes) with nitric acid solution of 30 mass %, and then the oxide film was formed on the surface of the substrate Al.

Process 5: A second zincate treatment (at normal temperature, for 30 minutes) was carried out with MCT-51.

After the substrate was subjected to the pretreatment, a plating film (first layer) as a base conductive layer was formed on the surface of the substrate by electroless plating with any of the plating baths Nos. A to C shown in Table 2. Thickness of the plating film was made to be 0.3 m. NPR-18, HBS-10, PMA-30 used as treating solutions were respectively NIMUDEN (a registered trademark) NPR-18, EPITHAS HBS-10, EPITHAS PMA-30 available from C. Uyemura & Co., Ltd.

After the formation of the base conductive layer, a plating film as a second layer was formed on the surface of the base conductive layer by electroless plating with a plating bath shown in Table 2. Thickness of the plating film was made to be 0.3 μm. Also, in some Examples, plating films as a third layer and a forth layer were further sequentially formed in a similar way, thereby each samples of Examples were prepared. TFP-23, TFP-30, NWP, HWP-1, TMX-16, RSL-34 used as treating solutions were respectively EPITHAS TFP-23, EPITHAS TFP-30, TRIALLOY (a registered trademark) NWP, EPITHAS HWP-1, GOBRIGHT (a registered trademark) TMX-16, EPITHAS RSL-34 available from C. Uyemura & Co., Ltd.

In Test Nos. 9 to 13 and 16 to 19 in which a Pt layer was formed, each sample was prepared in a similar way except that each of the layers was formed by electroless plating shown in Table 2 after the substrate was subjected to the pretreatment and then cylindrical openings having its diameter of 100 m were formed on a resist film. Furthermore, each sample was prepared in a similar way except that the diameter of the openings was changed to 20 μm. In Test Nos. 9 to 13 and 16 to 19, after the formation of the Pt plating layer and then an external observation, an Au layer or an Ag layer was formed.

Diffusion Evaluation on Outermost Surface of Au Layer or Ag Layer Samples were subjected to heat treatment at 300° C. for one hour as a simulation of a thermal history imposed during an actual manufacturing process of IC chips. After the heat treatment, concentrations of metal elements other than Au or Ag formed an outermost surface were examined by elemental analysis of the outermost surface of the plating film (Au layer or Ag layer) on the samples via Auger electron spectroscopy under the following condition. The results are shown in a 'Concentration of metal element on outermost surface' section in Table 2. In the section, '%' means 'atom %' (specified as 'at. %' in the table). Detection of a metal element other than Au or Ag indicates that the metal element was diffused into the outermost surface.

Auger Electron Spectroscopy
Device: Field Emission Auger Microprobe (JAMP-9500F available from JEOL Ltd.)
EIT (Electron High Tension): 30 kV
Probe Current: 1 nA
Probe Dia.: Minimum External Observation of Pt Plating Film In Test Nos. 9 to 13 and 16 to 19, after the formation of the Pt plating film, a surface of the Pt plating film was observed with an optical microscope (VHX-5000 available from KEYENCE CORPORATION) and evaluated with the following criteria. The results are specified in a section of depositability in Table 2.

Deposited: The Pt plating film completely covered the Pd plating layer.

Not deposited: The Pt plating film was not at least formed partially.

TABLE 2

| No. | Plating film | Treating solution | | Treating temperature | Treating time | Film thickness | No. 1 | No. 2 | No. 3 | No. 4 | No. 5 | No. 6 | No. 7 | No. 8 | No. 9 | No. 10 |
|---|---|---|---|---|---|---|---|---|---|---|---|---|---|---|---|---|
| A | Ni—P | NPR-18 | | 80° C. | 2 min. | 0.3 um | First layer | | First layer | | | First layer | First layer | First layer | First layer | |
| B | Co—B | HBS-10 | | 70° C. | 1 min. | 0.3 um | | First layer | | First layer | | | | | | First layer |
| C | Cu | PMA-30 | | 33° C. | 10 min. | 0.3 um | | | | | First layer | | | | | |
| D | Pd | TFP-23 | | 60° C. | 5 min. | 0.3 um | | | Second layer | Second layer | Second layer | | | | | |
| E | Pd—P | TFP-30 | | 50° C. | 20 min. | 0.3 um | | | | | | Second layer | | | | |
| F | Ni—W—P | NWP | | 90° C. | 5 min. | 0.3 um | | | | | | | Second layer | | | |
| G | Co—W—P | HWP-1 | | 77° C. | 15 min. | 0.3 um | | | | | | | | Second layer | | |
| H | Pt | Sodium formate | 30 g/L | 80° C. | 5 min. | 0.3 um | | | | | | | | | Second layer | Second layer |
| | | Pt(NH₃)₄Cl₂(II) | 1.0 g/L (as Pt) | | | | | | | | | | | | | |
| | | Boric acid | 10 g/L | | | | | | | | | | | | | |
| | | Ammonuium chloride | 0.5 g/L | | | | | | | | | | | | | |
| | | Sodium chloride | 1 g/L | | | | | | | | | | | | | |
| | | pH | 10 | | | | | | | | | | | | | |
| K | Pt | 98 mass % Hydrazine monohydrate | 2 g/L | 50° C. | 5 min. | 0.3 um | | | | | | | | | | |
| | | Pt(NH₃)₄Cl₂(II) | 1.0 g/L (as Pt) | | | | | | | | | | | | | |
| | | 85 mass % Phosphoric acid | 5 g/L | | | | | | | | | | | | | |
| | | Ammonuium chloride | 10 g/L | | | | | | | | | | | | | |
| | | pH | 6 | | | | | | | | | | | | | |
| I | Au | TMX-16 | | 50° C. | 15 min. | 0.3 um | Second layer | Second layer | Third layer | Third layer | Third layer | Third layer | Third layer | Third layer | Third layer | Third layer |
| J | Ag | RSL-34 | | 50° C. | 30 min. | 0.3 um | | | | | | | | | | |
| | Depositability of Pt film | | | 100 um diameter Pad | | | Not treated | Not treated | Not treated | Not treated | Not treated | Not treated | Not treated | Not treated | Deposited | Deposited |

TABLE 2-continued

| | | | | | | No. 11 | No. 12 | No. 13 | No. 14 | No. 15 | No. 16 | No. 17 | No. 18 | No. 19 |
|---|---|---|---|---|---|---|---|---|---|---|---|---|---|---|
| Concentration of metal element on outermost surface (at %) | | | 20 um diameter Pad | | | Not treated | Not treated | Not treated | Not treated | Not treated | Not treated | Not treated | Not deposited | Not deposited |
| | | | 100 um diameter Pad | | | Ni: 40% | Co: 5% | Ni: 5% Pd: 5% | Co: 2% Pd: 5% | Cu: 5% Pd: 5% | Ni: 5% Pd: 5% | Ni: 15% | Co: 10% | N.D. |
| | | | 20 um diameter Pad | | | Ni: 40% | Co: 5% | Ni: 5% Pd: 5% | Co: 2% Pd: 5% | Cu: 5% Pd: 5% | Ni: 5% Pd: 5% | Ni: 15% | Co: 10% | N.D. |

| No. | Plating film | Treating solution | | Treating temperature | Treating time | Film thickness | No. 11 | No. 12 | No. 13 | No. 14 | No. 15 | No. 16 | No. 17 | No. 18 | No. 19 |
|---|---|---|---|---|---|---|---|---|---|---|---|---|---|---|---|
| A | Ni—P | NPR-18 | | 80° C. | 2 min. | 0.3 um | First layer | First layer | | First layer | First layer | First layer | | First layer | First layer |
| B | Co—B | HBS-10 | | 70° C. | 1 min. | 0.3 um | | | First layer | | | | First layer | | |
| C | Cu | PMA-30 | | 33° C. | 10 min. | 0.3 um | | | | | | | | | |
| D | Pd | TFP-23 | | 60° C. | 5 min. | 0.3 um | Second layer | | Second layer | | Second layer | Second layer | | Second layer | |
| E | Pd—P | TFP-30 | | 50° C. | 20 min. | 0.3 um | | Second layer | | | | | | | Second layer |
| F | Ni—W—P | NWP | | 90° C. | 5 min. | 0.3 um | | | | | | | | | |
| G | Co—W—P | HWP-1 | | 77° C. | 15 min. | 0.3 um | | | | | | | | | |
| H | Pt | Sodium formate | 30 g/L | 80° C. | 5 min. | 0.3 um | Third layer | Third layer | Third layer | | Third layer | | | | |
| | | Pt(NH$_3$)$_4$-Cl$_2$(II) | 1.0 g/L (as Pt) | | | | | | | | | | | | |
| | | Boric acid | 10 g/L | | | | | | | | | | | | |
| | | Ammonium chloride | 0.5 g/L | | | | | | | | | | | | |
| | | Sodium chloride | 1 g/L | | | | | | | | | | | | |
| | | pH | 10 | | | | | | | | | | | | |
| K | Pt | 98 mass % Hydrazine monohydrate | 2 g/L | 50° C. | 5 min. | 0.3 um | | | | | | | Second layer | Third layer | Third layer |
| | | Pt(NH$_3$)$_4$-Cl$_2$(II) | 1.0 g/L (as Pt) | | | | | | | | | | | | |
| | | 85 mass % Phosphoric acid | 5 g/L | | | | | | | | | | | | |
| | | Ammonium chloride | 10 g/L | | | | | | | | | | | | |
| | | pH | 6 | | | | | | | | | | | | |
| I | Au | TMX-16 | | 50° C. | 15 min. | 0.3 um | Forth layer | Forth layer | Forth layer | | | | | | |
| J | Ag | RSL-34 | | 50° C. | 30 min. | 0.3 um | | | | Second layer | Third layer | Forth layer | Third layer | Forth layer | Forth layer |
| | Depositability of Pt film | | | | 100 um diameter Pad | | Deposited | Deposited | Deposited | Not treated | Not treated | Deposited | Deposited | Deposited | Deposited |
| | | | | | 20 um diameter Pad | | Deposited | Deposited | Deposited | Not treated | Not treated | Deposited | Not deposited | Deposited | Deposited |

TABLE 2-continued

| | | | | | | | | | | |
|---|---|---|---|---|---|---|---|---|---|---|
| Concentration of metal element on outermost surface (at %) | 100 um diameter Pad | N.D. | N.D. | N.D. | Ni: 30% | Ni: 5% Pd: 5% | N.D. | N.D. | N.D. | N.D. |
| | 20 um diameter Pad | N.D. | N.D. | N.D. | Ni: 30% | Ni: 5% Pd: 5% | N.D. | Ni: 30% | N.D. | N.D. |

In the case that the Pt layer was not formed, that is, only intermediate conductive layer such as Pd (Nos. 3 to 5, 15), a Pd—P alloy layer (No. 6), a Ni—W—P alloy layer (No. 7), a Co—W—P alloy layer (No. 8) and the like was formed between the base conductive layer and the Au or Ag layer, or the intermediate conductive layer was not formed (No. 1, 2, 14), a base metal diffused into the outermost surface of the Au or Ag layer in both cases.

Also, the Pt layer formed Test Nos. 9 to 13, 16 to 19 showed favorable Pt film depositability notwithstanding whether the Pd layer was present or not in the case of a bump diameter was 100 µm. Thus a base metal was not detected on the outermost surface. Contrary to these case, no Pd layer or no Pd—P layer (hereinafter these are referred to as 'Pd layer') formed Test Nos. 9, 10, 17 showed inferior in depositability of the Pt in the case of a bump diameter was 20 µm. Thus a base metal was detected on the outermost surface. Specifically, the Pd layer formed Test Nos. 11 to 13, 16, 18 to 19 showed favorable depositability of Pt even for a micro bump having its diameter of 20 µm, and thus a base metal was not detected on the outermost surface.

Result of Table 2 showed that Pt layer without Pd layer cannot exhibit a favorable covering property in the case of a micro bump diameter is 20 µm or less, and thus resulted in insufficient diffusion preventing effect although the Pt layer itself has the diffusion preventing effect of a base metal. Contrarily, in the case of a micro bump having Pd layer, Pt layer having excellent covering property can be formed on the Pd layer and thus resulted in favorable diffusion preventing effect.

Example 2

After a Pt plating bath having composition shown in Table 4 had been kept for 30 days under the following condition, stability of the Pt plating bath was evaluated. Amongst the Pt plating baths evaluated as 'Favorable' based on the following criteria, depositability of a Pt plating film was evaluated. Conversely, the Pt plating baths evaluated as 'Poor' or 'Failure' were unsuitable for an industrial scale production due to its low plaiting bath stability, and thus formation of the Pt plating film was not attempted except for some of them.

After the Pt plating film was formed on a substrate by sequentially carrying out electroless plating, a surface appearance of the Pt plating film was observed.

First of all, the substrate (Al TEG wafer) was subjected to a pretreatment by carrying out processes 1 to 5 under a condition shown in Table 3 prior to the electroless plating.

TABLE 3

| | Pretreating process | Treating solution | Treating temperature | Treating time (second) |
|---|---|---|---|---|
| 1 | Degreasing | MCL-16 | 50° C. | 300 |
| 2 | Pickling | 30 mass % Nitric acid | Normal Temperature | 60 |
| 3 | First zincate | MCT-51 | Normal Temperature | 30 |
| 4 | Pickling | 30 mass % Nitric acid | Normal Temperature | 60 |
| 5 | Second zincate | MCT-51 | Normal Temperature | 30 |
| 6 | Electroless Ni | NPR-18 | 80° C. | 180 |
| 7 | Electroless Pd | TFP-23 | 60° C. | 500 |
| 8(i) | Electroless Pt | No. 1-11, 15-17 | 80° C. | 300 |
| 8(ii) | Electroless Pt | No. 12-14 | 50° C. | 300 |

After the substrate was subjected to the pretreatment, a resist film was formed, and then cylindrical openings having 100 µm diameter were formed on the resist film. Thereafter, a Ni plating film and then a Pd plating film were formed in order from the substrate by sequentially carrying out electroless Ni plating and electroless Pd plating under conditions shown in Table 3.

After the Pd plating film was formed, the Pt plating film was formed by using each of electroless Pt plating solutions shown in Table 4 under conditions shown in Table 3, and then each sample was prepared.

Samples were prepared in a similar way to the above except that the diameter of the openings formed on the resist film was changed to 20 µm.

A surface appearance of the Pt plating film was observed in a similar way to Example 1.

Stability of Pt Plating Bath

Each of the electroless Pt plating baths in Table 4 had been kept for 30 days at a predetermined temperature that had been 50° C. if hydrazine was selected as a reducing agent, or 80° C. if formic acid was selected as a reducing agent, and then the Pt bath was visually observed whether deposition of Pt particles arose in the Pt plating baths. The results were evaluated with the following criteria and then specified in Table 4.

Favorable: The deposition of the Pt particles was not confirmed during the evaluation period.

Poor: The deposition of the Pt particles was confirmed within 24 to 240 hours from the commencement of the evaluation.

Failure: The deposition of the Pt particle was confirmed in less than 24 hours from the commencement of the evaluation.

TABLE 4

| Composition of Pt plating bath | | No. 1 | No. 2 | No. 3 | No. 4 | No. 5 | No. 6 | No. 7 | No. 8 | No. 9 | No. 10 | No. 11 |
|---|---|---|---|---|---|---|---|---|---|---|---|---|
| Sodium formate | g/L | 10 | 10 | 10 | 10 | 10 | 10 | 10 | 10 | 10 | 10 | 10 |
| 98 mass % Hydrazine monohydrate | g/L | | | | | | | | | | | |
| $Pt(NH_3)_4Cl_2(II)$ (as Pt) | g/L | 1 | 1 | 1 | 1 | 1 | 1 | 1 | 1 | 1 | 1 | 1 |
| Boric acid | g/L | 20 | 20 | 20 | 20 | 20 | 20 | 20 | 20 | 20 | 20 | 20 |
| 85 mass % Phosphoric acid | g/L | | | | | | | | | | | |
| Ammonium chloride | g/L | | 1 | 5 | 10 | 20 | | | | | | |
| Sodium chloride | g/L | | | | | | 5 | 10 | | | 5 | 10 |
| 28 mass % ammonium hydroxide | mL/L | | | | | | | | 15 | 30 | 15 | 30 |
| pH | | 10 | 10 | 10 | 10 | 10 | 10 | 10 | 10 | 10 | 10 | 10 |
| Bath temperature | °C. | 80 | 80 | 80 | 80 | 80 | 80 | 80 | 80 | 80 | 80 | 80 |
| Stability of bath | | Failure | Favorable | Favorable | Favorable | Favorable | Poor | Poor | Poor | Poor | Favorable | Favorable |
| Depositability of Pt film | 100 um diameter Pad | — | Deposited | Deposited | Deposited | Deposited | — | — | — | Deposited | Deposited | Not deposited |
| | 20 um diameter Pad | — | Deposited | Deposited | Deposited | Not deposited | — | — | — | Not deposited | Not deposited | Not deposited |

| Composition of Pt plating bath | | No. 12 | No. 13 | No. 14 | No. 15 | No. 16 | No. 17 |
|---|---|---|---|---|---|---|---|
| Sodium formate | g/L | | | | 10 | 10 | 10 |
| 98 mass % Hydrazine monohydrate | g/L | 2 | 2 | 2 | | | |
| $Pt(NH_3)_4Cl_2(II)$ (as Pt) | g/L | 1 | 1 | 1 | 1 | 1 | 1 |
| Boric acid | g/L | | | | 20 | 20 | 20 |
| 85 mass % Phosphoric acid | g/L | 5 | 5 | 5 | | | |
| Ammonium chloride | g/L | | 10 | | 0.1 | 0.01 | 0.001 |
| Sodium chloride | g/L | | | 10 | | | |
| 28 mass % ammonium hydroxide | mL/L | | | 30 | | | |
| pH | | 6 | 6 | 6 | 10 | 10 | 10 |
| Bath temperature | °C. | 50 | 50 | 50 | 80 | 80 | 80 |
| Stability of bath | | Failure | Failure | Failure | Favorable | Favorable | Favorable |
| Depositability of Pt film | 100 um diameter Pad | — | Deposited | Deposited | Deposited | Deposited | Deposited |
| | 20 um diameter Pad | — | Deposited | Not deposited | Deposited | Deposited | Deposited |

In table 4, test Nos. 2 to 4, 15 to 17 are examples using the electroless Pt plating baths containing a water-soluble platinum compound solution ($Pt(NH_3)_4Cl_2(II)$ solution) with 1.0 g platinum concentration, a reducing agent (10 g/L sodium formate), a buffer agent (boric acid) and ammonium chloride of a predetermined amount, and having adjusted pH value of 10. Although amounts of ammonium chloride contained were modified in Test Nos. 2 to 4, 15 to 17, both bath stability and Pt depositability on a 20 μm diameter Pad were excellent in any of the cases, and thus favorable Pt plating films were formed. In addition, detailed study in the bath stability of Test Nos. 2 to 5, 15 to 17 revealed that the bath stability tended to be enhanced as a concentration of ammonium chloride increased.

Test No. 1 is an example without ammonium chloride addition. Test No. 1 had low bath stability and resulted in Pt particle deposition in the plating bath after a few hours from the commencement of the process.

Test No. 5 is an example with excessive concentration of ammonium chloride. Test No. 5 exhibited excellent in bath stability and Pt depositability on 100 μm diameter Pad whereas Test No. 5 exhibited inferior Pt depositability on a 20 μm diameter Pad. This result reveals that excessive concentration of ammonium chloride lowered depositability of Pt on a micro bump.

Test Nos. 6 to 11 are examples using the electroless Pt plating baths containing sodium chloride (Nos. 6, 7) as a chloride compound, ammonium hydroxide (Nos. 8, 9) or sodium chloride and ammonium hydroxide (Nos. 10, 11) instead of ammonium chloride. Test Nos. 6, 7 using sodium chloride and Test Nos. 8, 9 using ammonium hydroxide showed low bath stability. Test Nos. 10, 11 using both sodium chloride and ammonium hydroxide showed favorable bath stability even though Test Nos. 10, 11 showed low Pt depositability on a 20 μm diameter Pad indicating that bath stability and Pt depositability could not be balanced. Besides, Pt depositability was examined by using Pt plating bath of Test No. 9, which was evaluated as poor on plating bath stability, and the result of Test No. 9 showed low depositability on a 20 μm diameter Pad and thus a desired Pt plating film could not be formed.

Test Nos, 12 to 14 are examples using hydrazine as a reducing agent instead of formic acid. Test No. 13 is an example using ammonium chloride resulted in low bath stability. These results indicate that enhancing effects on bath stability derived from an addition of ammonium chloride were more likely achieved by the presence of formic acid than that of hydrazine. Conversely, Test No. 12 without containing ammonium chloride showed low bath stability resulted in deposition of Pt particles in the plating bath after a few hours from commencement of a process. Also, Test No. 14 is an example using sodium chloride and ammonium hydroxide instead of ammonium chloride resulted in low bath stability. Besides, Pt depositability was examined by using the Pt plating baths of Test Nos. 13, 14, which was evaluated as poor on plating bath stability, and the result showed that the Pt depositability on a 20 μm diameter Pad could be confirmed in Test No. 13 but not in Test No. 14. This result indicates that containing ammonium chloride yields Pt depositability even though a plating bath stability was low. Conversely, when no ammonium chloride was contained, no Pt depositability was yielded.

DESCRIPTION OF REFERENCE SIGNS

1: Base Substrate
2: Connecting Part
3: Base Conductive Layer
4: Pd Layer
5: Pt layer
6: Au Layer or Ag Layer
7: Conductive Bump
8: Counterpart Substrate
10: Substrate

The invention claimed is:

1. A conductive bump formed on a substrate comprising in order from the substrate:
a base conductive layer;
a first layer consisting essentially of palladium (Pd) or consisting essentially of a Pd-phosphorous (P) alloy;
a second layer directly contacting the first layer, the second layer consisting essentially of platinum (Pt); and
a third layer on the second layer, the third layer consisting essentially of gold (Au) or silver (Ag),
wherein a diameter of the conductive bump is 20 μm or less.

2. The conductive bump according to claim 1, wherein the base conductive layer is at least one metal selected from the group consisting of nickel (Ni), copper (Cu), cobalt (Co), aluminum (Al) and tungsten (W) or an alloy thereof.

3. An electronic component comprising the substrate according to claim 2 and a counterpart substrate, wherein the substrate and the counterpart substrate are electrically connected with each other by the Au layer or the Ag layer of the substrate.

4. An electroless Pt plating bath comprising a water-soluble platinum compound, a reducing agent, a buffer agent and ammonium chloride,
wherein the electroless Pt plating bath has a platinum concentration of less than 2.0 g/L, and
wherein the electroless Pt plating bath is effective to form the Pt layer directly contacting the Pd layer in the conductive bump formed on the substrate according to claim 3.

5. The electroless Pt plating bath according to claim 4, wherein the reducing agent is at least one selected from the group consisting of formic acid or a salt thereof and a hydrazine compound.

6. An electroless Pt plating bath comprising a water-soluble platinum compound, a reducing agent, a buffer agent and ammonium chloride,
wherein the electroless Pt plating bath has a platinum concentration of less than 2.0 g/L, and
wherein the electroless Pt plating bath is effective to form the Pt layer directly contacting the Pd layer in the conductive bump formed on the substrate according to claim 2.

7. The electroless Pt plating bath according to claim 6, wherein the reducing agent is at least one selected from the group consisting of formic acid or a salt thereof and a hydrazine compound.

8. An electronic component comprising the substrate according to claim 1 and a counterpart substrate, wherein the substrate and the counterpart substrate are electrically connected with each other by the Au layer or the Ag layer of the substrate.

9. An electroless Pt plating bath comprising a water-soluble platinum compound, a reducing agent, a buffer agent and ammonium chloride,
wherein the electroless Pt plating bath has a platinum concentration of less than 2.0 g/L, and
wherein the electroless Pt plating bath is effective to form the Pt layer directly contacting the Pd layer in the conductive bump formed on the substrate according to claim 8.

10. An electroless Pt plating bath comprising a water-soluble platinum compound, a reducing agent, a buffer agent and ammonium chloride,
wherein the electroless Pt plating bath has a platinum concentration of less than 2.0 g/L, and
wherein the electroless Pt plating bath is effective to form the Pt layer directly contacting the Pd layer in the conductive bump formed on the substrate according to claim 1.

11. The electroless Pt plating bath according to claim 10, wherein the reducing agent is at least one selected from the group consisting of formic acid or a salt thereof and a hydrazine compound.

12. The electroless Pt plating bath according to claim 9, wherein the reducing agent is at least one selected from the group consisting of formic acid or a salt thereof and a hydrazine compound.

13. The conductive bump according to claim 1, wherein the Au layer or the Ag layer is formed as an outermost surface of the conductive bump.

* * * * *